(12) United States Patent
De Vries et al.

(10) Patent No.: US 8,217,655 B2
(45) Date of Patent: Jul. 10, 2012

(54) AUTOMATED TRANSPORT DEVICE FOR NMR MEASURING SAMPLES, CRYO-MAGNETIC SYSTEM WITH AUTOMATED TRANSPORT DEVICE, TRANSPORT CONTAINER FOR AN AUTOMATED TRANSPORT DEVICE AND METHOD FOR CONVEYING AN NMR MEASURING SAMPLE

(75) Inventors: Jonathan De Vries, Zurich (CH); Daniel Guy Baumann, Zurich (CH); Oskar Schett, Uster (CH); Werner Maas, Merrimac, MA (US)

(73) Assignee: Bruker BioSpin AG, Faellanden (CH)

( * ) Notice: Subject to any disclaimer, the term of this patent is extended or adjusted under 35 U.S.C. 154(b) by 380 days.

(21) Appl. No.: 12/637,791

(22) Filed: Dec. 15, 2009

(65) Prior Publication Data
US 2010/0156422 A1    Jun. 24, 2010

(30) Foreign Application Priority Data
Dec. 19, 2008   (DE) .......................... 10 2008 063 703

(51) Int. Cl.
*G01V 3/00*   (2006.01)
(52) U.S. Cl. ....................................... 324/321
(58) Field of Classification Search ........... 324/300–322
See application file for complete search history.

(56) References Cited

U.S. PATENT DOCUMENTS

| | | | |
|---|---|---|---|
| 4,859,948 A | 8/1989 | Kuster | |
| 5,146,166 A | 9/1992 | Bartuska | |
| 5,201,184 A * | 4/1993 | Roth | 62/47.1 |
| 5,534,780 A | 7/1996 | Lilly | |
| 5,642,625 A * | 7/1997 | Cates et al. | 62/55.5 |
| 5,809,801 A * | 9/1998 | Cates et al. | 62/637 |
| 5,860,295 A * | 1/1999 | Cates et al. | 62/637 |
| 7,248,050 B2 | 7/2007 | Hofmann | |
| 7,372,274 B2 * | 5/2008 | Ardenkjaer-Larsen et al. | 324/321 |

FOREIGN PATENT DOCUMENTS

| | | |
|---|---|---|
| DE | 195 43 416 | 5/1997 |
| EP | 0 502 444 | 9/1992 |

(Continued)

OTHER PUBLICATIONS

"Sample-Rail", Bruker, http://www.bruker-biospin.com/sample_rail.html, 2008.

(Continued)

*Primary Examiner* — Dixomara Vargas
(74) *Attorney, Agent, or Firm* — Paul Vincent

(57) ABSTRACT

A transport device for conveying an object to be transported (18) between an input point (A) and a supply point (Z), where the object to be transported (18) can be supplied to an RT tube (4) of a cryostat (1), wherein the input point (A) is both horizontally and also vertically spaced apart from the supply point (Z), wherein a transport tube (14) is provided for pneumatically conveying the object to be transported within the transport tube (14) from a first transfer point (B) to a second transfer point (C), is characterized in that the transport tube (14) is vertically arranged, a first transport container (TB1) and a second transport container (TB2) are provided for receiving the object to be transported (18), a first transfer device is disposed between the input point (A) and the first transfer point (B), and a second transfer device is provided between the second transfer point (C) and the supply point (Z).

28 Claims, 9 Drawing Sheets

FOREIGN PATENT DOCUMENTS

| | | |
|---|---|---|
| EP | 1 895 314 | 3/2008 |
| JP | 62 092461 | 6/1987 |
| JP | 2006 234539 | 9/2006 |

OTHER PUBLICATIONS

"Sample Jet", Bruker, http://www.bruker-biospin.com/samplejet.html, 2008.

"BACS", Bruker, http://www.bruker-biospin.com/bacs.html, 2008.

"NMR Case", Bruker, http://www.bruker-biospin.com/sample_rail0.html, 2008.

"Sample Changer ASC", JEOL, http://www.jeolusa.com/PRODUCTS/AnalyticalInstruments/NuclearMagneticResonance/SampleChangers/tabid/389/Default.aspx, 2008.

"Carousel Autosampler", VARIAN, http://www.varianinc.com/cgi-bin/nav?products/nmr/accessory/auto_samplers/carousel/carousel_specs&cid=KLILILKJFN, 2007.

\* cited by examiner

PRIOR ART
PRIOR ART
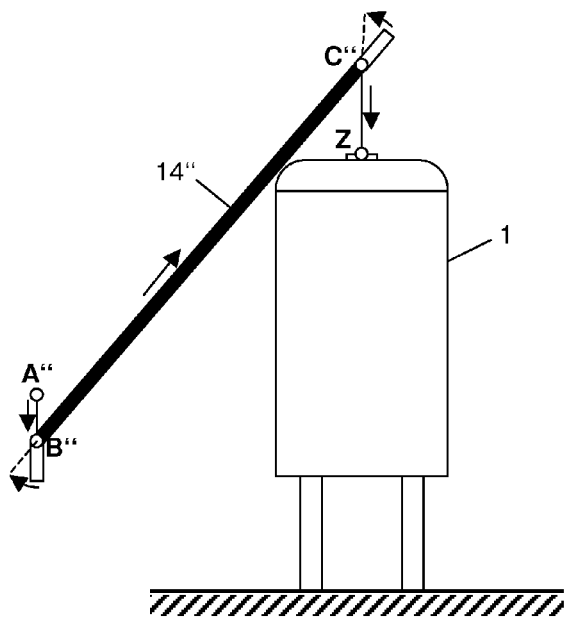
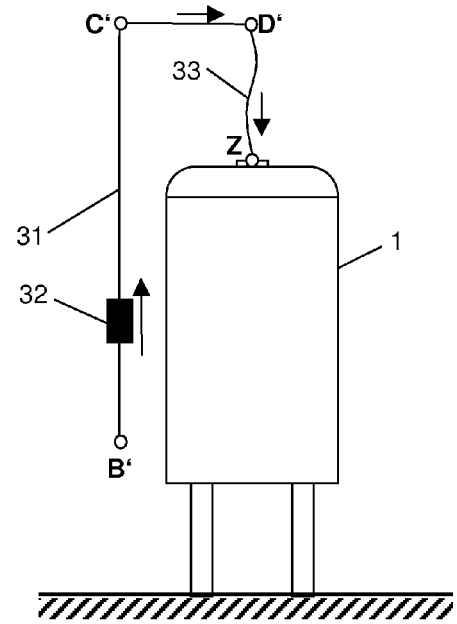
Fig. 2a
Fig. 2b
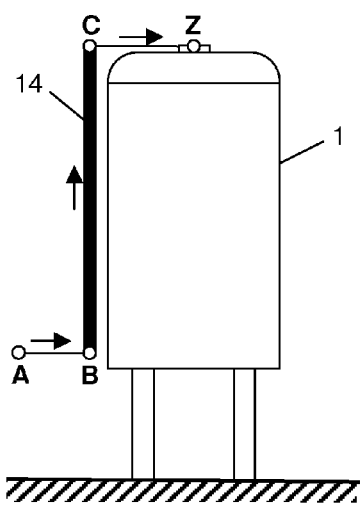
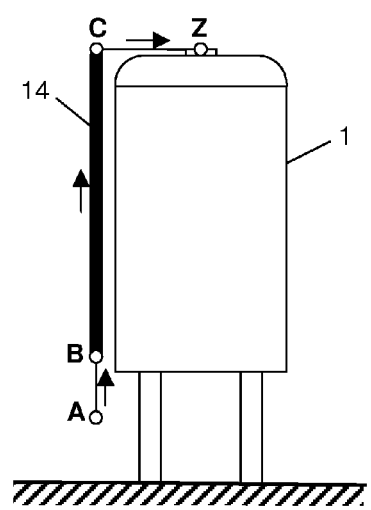
Fig. 3a
Fig. 3b

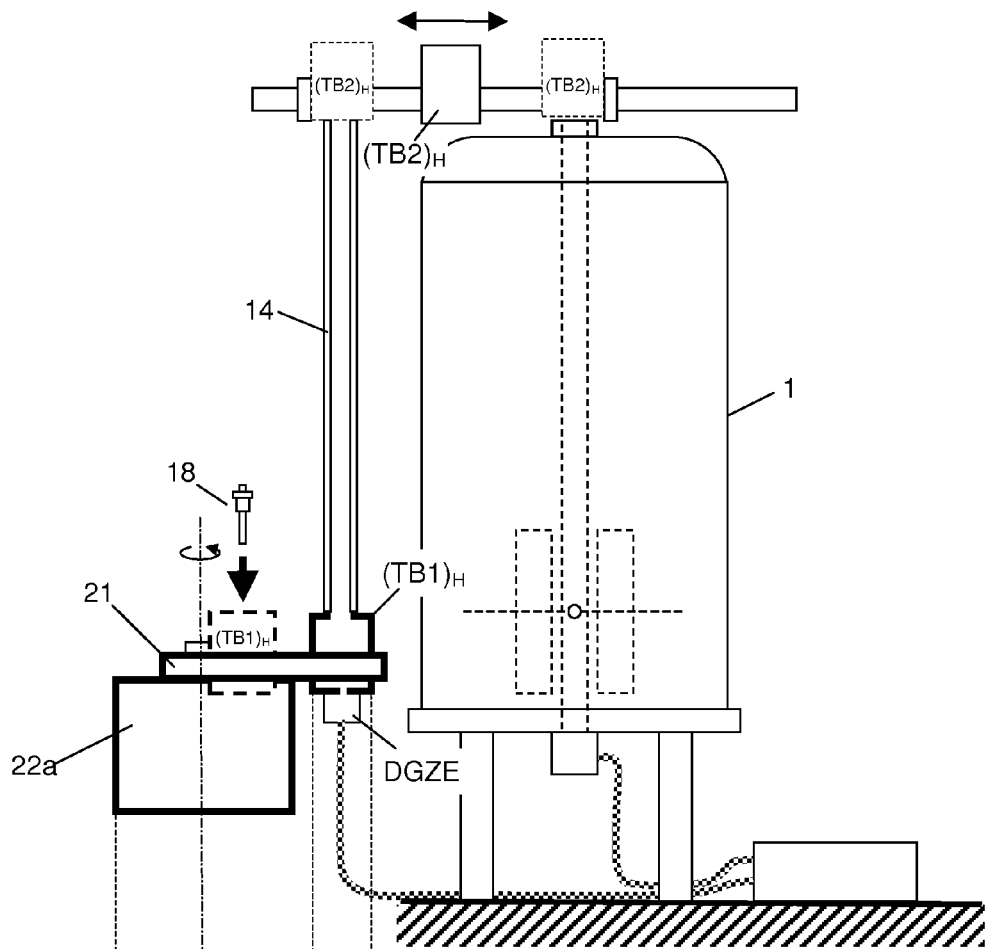
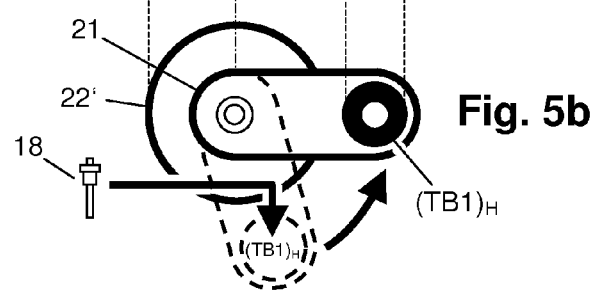
Fig. 5a
Fig. 5b

AUTOMATED TRANSPORT DEVICE FOR NMR MEASURING SAMPLES, CRYO-MAGNETIC SYSTEM WITH AUTOMATED TRANSPORT DEVICE, TRANSPORT CONTAINER FOR AN AUTOMATED TRANSPORT DEVICE AND METHOD FOR CONVEYING AN NMR MEASURING SAMPLE

This application claims Paris Convention priority of DE 10 2008 063 703.3 filed Dec. 19, 2008 the complete disclosure of which is hereby incorporated by reference.

BACKGROUND OF THE INVENTION

The invention concerns a transport device for conveying an object to be transported between an input point where the object to be transported can be inserted into and removed from the transport device, and a supply point where the object to be transported can be supplied to an RT tube of a cryostat, wherein the object to be transported comprises an NMR measuring sample and a sample holder, wherein the input point is both horizontally and also vertically spaced apart from the supply point, and wherein a transport tube is provided for pneumatically conveying the object to be transported within the transport tube from a first transfer point at the lower end of the transport tube to a second transfer point at the upper end of the transport tube.

A device of this type is disclosed in DE 3729819 C2 [1].

NMR spectrometers have been further developed and become much more powerful since the 1950s. They are practically always operated with a fast computer in order to especially enable the application of the fast Fourier Transformed NMR spectroscopy method (FFT-NMR), and they are moreover almost exclusively operated with superconducting magnet systems with fields of up to 20 Tesla.

The installed computer not only enables performance of fast FFT but can also be used for automation tasks such as e.g. automated transport of the NMR measuring sample from a location that is easily accessible to the user to the magnetic center of the superconducting magnet and back. This automated transport is very advantageous, in particular, for high-field magnets with fields between 16 T and 20 T, since these magnet systems may have a height of more than 2.50 meters and the NMR measuring sample must be introduced in the upper area of the magnet system.

The "SampleJet" [3] of the company Bruker is a conventional transport device. It is a sample automated device with a magazine capacity of up to 480 NMR sample tubes that can be manually supplied to the automated device magazine in the form of 5 cassettes of 96 pieces of sample tubes each together with up to 47 objects to be transported. The objects to be transported may be supplied to the NMR measurement either individually, in selected or sequential order. The sample automated device can combine NMR sample tubes (20) with sample holders (19) to form objects to be transported (18), and subsequently supply these to the NMR measurement or supply the objects to be transported (18) directly and without further manipulation to the NMR measurement.

A further conventional transport device is the "BACS" [4] of the company Bruker. It is a sample automated device with chain cycle, which is available with a magazine capacity of 60 or 120 objects to be transported. The objects to be transported can be supplied to the NMR measurement individually, in selected or sequential order.

One further conventional transport device is the "NMR Case" [5] of the company Bruker. It is a sample carousel automated device comprising a magazine capacity of 24 objects to be transported. The objects to be transported can be supplied to the NMR measurement individually and only in sequential order.

A further conventional transport device is the "Sample Changer" ASC [6] of the company Jeol. It is a sample carousel automated device that is available with magazine capacities of 8, 16, or 64 objects to be transported. The objects to be transported can be supplied to the NMR measurement individually, in selected or sequential order.

A further conventional transport device is the "Carousel Autosampler" [7] of the company Varian. It is a sample automated device comprising a magazine with a receiving capacity of 9 objects to be transported. The objects to be transported can be supplied to the NMR measurement individually, in selected or sequential order.

The above-described transport devices are disadvantageous in that the user must access the height range of the upper end of the RT tube in order to supply the automated device with objects to be transported (and in [3] to supply the cassettes or in [5] to change the carousel cassette), which necessitates auxiliary means such as ladders, stairs or even scaffoldings for larger magnets. Auxiliary means of this type, however, are awkward and some of them are very expensive.

[2] discloses an automatic transport device ("SampleRail" of the company Bruker), which is schematically shown in FIG. 2b. This conventional transport device conveys the object to be transported from a location that is easily accessible to the user (point B') via points C' and D' to a supply point Z, from which the object to be transported can be inserted into the RT tube of a cryostat 1, and back. This transport device compensates for a height difference between the points B' and C' by means of a pneumatically driven linear axis 31. The linear axis 31 has a linear guidance with integrated pneumatic drive comprising a piston with mechanically connected carrier, to which the parts to be moved can be fixed, a cylinder and corresponding sealing elements. The object to be transported is thereby located in a transport container 32 that his decoupled from the carriage of the linearly arranged linear axis 31 at point C', and is transferred through coupling to the carriage of a horizontally arranged linear axis. The carriage conveys the object to be transported to point D'. A flexible hose 33 is located between point D' and the supply point Z to ensure guidance of the object to be transported 18 even when the vibration-damped and thereby "floatingly" disposed cryostat is lifted or inclined due to evaporation of the coolant.

The transport device of [2] is disadvantageous in that, for conveying the object to be transported in a horizontal and vertical direction, an expensive transport container 32 with expensive coupling adaptation is required for receiving the transport container on the horizontal and vertical linear axis. Since the transport container 32 is not confined to the linear axis 31 during the vertical movement, but is moved outside of and along the linear axis formed as a cylinder, this system moreover necessitates expensive safety provisions in the area where the user moves in order to prevent damage to the object to be transported and also to the operating staff.

The stroke of the pneumatic linear axis 31 depends on the room height and the size of the cryostat. Local adjustment of the linear axis length 31 cannot be economically performed owing to complex seals, the tools that are required etc., for which reason any re-mounting necessitates complex work preparations and customer-specific material procurement.

The transport device disclosed in [2] is self-supporting (not shown in FIG. 2) and highly massive. Due to the resulting net weight, it must not be fixedly connected to the cryostat 1

(danger of tilting). Due to the fact that this transport device is not fixedly connected to the vibration-damped cryostat 1 and has no active vibration damping itself, one tried to manage with the flexible hose 33 between point D' and point Z (FIG. 2b). This hose 33, however, cannot damp all vibrations and is constricted when the cryostat 1 is lowered (this is the case when cryostats 1 are being filled with helium or nitrogen). The diameter of the hose 33 is reduced by the constriction, which causes repeated jamming of the object to be transported.

[1] describes a pneumatically operating transport device consisting of a tube (inclined tube 14") that is disposed at an inclination and extends from point B" to point C" (FIG. 2a), and in which the NMR measuring sample located in a sample holder can be transported by means of pressure gas in an upward or downward direction (FIG. 1). An input point A" is located at a location that can be easily accessed by the user and point C" is located close to the upper opening of the room temperature tube (RT tube) that belongs to the NMR cryostat 1.

The transport device of [1] is disadvantageous in that the object to be transported and thereby the highly sensitive samples contained therein are rotated out of the vertical axis due to the position of the inclined tube 14". Friction is generated between the inner tube surface and the sample holder due to the inclined position of the tube 14" and the net weight force of the object to be transported. Depending on the angle position of the inclined tube 14" and the position of center of gravity of the object to be transported (which changes in dependence on the sample fill level, diameter of the NMR sample tube and sample holder type), the object to be transported tends to get jammed between the inner surface of the inclined tube 14" in various ways. These jamming effects are particularly severe in the transition areas between the upper and lower pivot tube and the inclined tube 14", and further increase the more the inclined position of the inclined tube 14" approaches the horizontal position. Moreover, the required room height becomes larger the closer the operating staff wishes the easily accessible location to be with respect to the cryostat 1 and the larger the diameter of the cryostat 1. FIG. 2a shows how these requirements result in that the path between point C" and the supply point Z becomes larger and larger and thereby also the required room height. When the inclined tube 14" terminates in the table top of a console and is fixedly connected thereto (see document [1], FIG. 2, element 65, description paragraph 35), mechanical vibrations can be transferred from the table top of a console to the transport device and from there to the cryostat 1, which is to be prevented.

It is therefore the underlying purpose of the invention to propose an inexpensive transport device for transporting an object to be transported to the upper end of an RT tube of a cryomagnet system, which is compact and at the same time also ensures reliable transport of samples.

SUMMARY OF THE INVENTION

This object is achieved in accordance with the invention in that the transport tube is vertically arranged, a first transport container is provided for receiving the object to be transported, a first transfer device is disposed between the input point and the first transfer point for conveying the first transport container between the input point and the first transfer point, a second transport container is provided for receiving the object to be transported, and a transfer device is disposed between the second transfer point and the supply point for conveying the second transport container between the second transfer point and the supply point.

The object to be transported is inserted into the first transport container at the input point, is moved from the input point to the first transfer point by means of the first transfer device, is lifted out of the first transport container by means of pressure gas, and is conveyed in an upward direction within the transport tube to the second transport container located above the second transfer point C. The object to be transported is conveyed from the second transfer point to the supply point by means of the second transport container, from where the object to be transported can be transferred into the measuring chamber located in the RT tube. The object to be transported can be conveyed again from the measuring chamber to the input point in the same way.

In accordance with the inventive transport device, the axis of the object to be transported does not need to be inclined, for which reason the object to be transported can always remain in a vertical position. The vertical position of the pneumatically operating transport tube elegantly prevents jamming of the object to be transported and the shape of the sample holder ("spinner") that has been successfully used for many years can remain unchanged.

The object to be transported is conveyed in a direct and simple fashion in the transport tube by means of the pressure gas without requiring an additional complex transport carriage including drive, which can receive, convey and subsequently deliver again the transport container including the object to be transported.

Since the object to be transported itself acts as a piston within the transport tube and the inner surface of the transport tube acts as a cylinder, no further elements are necessary in contrast to the use of massive pneumatic cylinders with driver carriers and guidance. For this reason, the inventive transport device can be designed in such a fashion that it can be exclusively mounted to the cryostat such that the transfer of vibrations from the surroundings to the cryostat is minimized and no additional vibration damping measures are required.

The first transfer device advantageously comprises a guiding rail along which the first transport container can be moved.

The first transfer device alternatively may have a pivot arm that can be rotated about an axis and is suited to receive the first transport container and convey the first transport container by means of a rotary motion of the pivot arm from the input point to the first transfer point.

In a further alternative embodiment, the first transfer device comprises a carousel that can be rotated about an axis of rotation and has a plurality of first transport containers that are disposed in a circle, the center of which is located on said axis of rotation, wherein the transport containers can be moved by a rotary motion of the carousel from the input point to the first transfer point. Objects to be transported can thereby be conveyed within short time intervals without requiring additional engagement.

The second transfer device advantageously has a guiding rail along which the second transport container can be moved.

In a particularly advantageous design, the transport tube has a vertical symmetry axis, and both the first transfer point and the second transfer point are disposed on the symmetry axis of the transport tube. Positioning of the object to be transported on the symmetry axis of the transport tube ensures optimum transport of the object to be transported through the transport tube.

The first transport container advantageously has an upper opening for receiving the object to be transported, the diameter of which is equal to the inner diameter of the transport tube. This facilitates transfer of the object to be transported between the first transport container and the transport tube.

In another advantageous design, the second transport container has a lower opening for receiving the object to be transported, the diameter of which is equal to the inner diameter of the transport tube.

In order to ensure simple handling, the input point is advantageously located at a height above a horizontal bottom level, which can be easily accessed by the user, in particular, at breast height of a person.

In one particularly preferred embodiment of the inventive transport device, the second transfer point is disposed horizontally next to the supply point. This minimizes the height.

Different arrangements of the input point are advantageous in dependence on the amount of space. The input point may e.g. be disposed vertically below the first transfer point.

The input point may alternatively also be disposed horizontally next to the first transfer point.

A particular embodiment of the inventive transport device has a pressure gas supply element that is disposed vertically below and at a separation from the first transfer point, the separation being selected such that the first transport container just about fits into the space between the lower end of the transport tube and the upper end of the pressure gas supply element, preferably in a contact-free fashion, wherein the pressure gas supply element has an opening facing the lower end of the transport tube and is connected to a pressure gas generator by means of a pressure gas line. Pressure gas can be guided through the transport container by means of the pressure gas supply element without requiring a direct connection to the transport container. The transport container can thereby also be easily moved over large distances between the input point and the first transfer point without having to provide a pressure gas line of a corresponding length.

In order to optimize the pressure gas supply to the transport tube, the opening of the pressure gas supply element is advantageously orientated coaxially with respect to the transport tube.

In the operating state, the pressure gas supply element is advantageously connected in a gas-tight fashion to the pressure gas line on the side opposite to the opening, thereby generating a vertical upward flow of gas.

In another embodiment, a pressure gas line is connected in a gas-tight fashion to the lower opening of the first transport container in the operating state. This is particularly advantageous when the transport container is only moved over short distances. In this case, no additional pressure gas supply element is required.

The present invention also concerns a cryomagnet system with a cryostat and a transport device according to any one of the preceding claims, wherein the cryostat has a continuous and vertically extending RT tube for receiving the object to be transported, wherein the input point is horizontally spaced apart from the cryostat, and wherein the supply point is located above the RT tube on the symmetry axis thereof. A cryomagnet system of this type is space saving and not susceptible to disturbances, since the object to be transported rarely gets jammed within the inventive transport device.

In one particularly preferred embodiment of the inventive cryomagnet system, the transport device is exclusively rigidly connected to the cryostat. Additional vibration damping of the transport device with respect to the surroundings is therefore not necessary.

The inner diameter of the transport tube is advantageously equal to the inner diameter of the RT tube. The second transport container can then be optimized to this diameter.

A pressure gas generator is preferably provided, which is connected to the RT tube via a pressure gas line in such a fashion that pressure gas can flow from the area of the magnetic center to the upper end of the RT tube. The pressure gas can be introduced e.g. at the upper end of the RT tube into a gas channel that is separate from the RT tube, be deflected in the area of the magnetic center, and subsequently flow within the RT tube to the upper end thereof.

The invention also concerns a first transport container for use in a transport device as described above, with an upper opening for receiving an object to be transported comprising a sample holder and an NMR measuring sample, and a lower opening disposed opposite thereto for supplying pressure gas.

The invention moreover concerns a second transport container for use in a transport device as described above, with an upper ventilation opening and a lower opening disposed opposite thereto for receiving an object to be transported comprising a sample holder and an NMR measuring sample, and with a holding device that can be activated and deactivated and, in the deactivated state, prevents the object to be transported from falling down, and in the activated state releases the object to be transported.

The holding device advantageously comprises a locking bolt that can be moved in a horizontal direction. This represents one simple, reliable and operationally safe possibility of securing the object to be transported.

The invention also concerns a method for conveying an object to be transported between an input point and a supply point, where the object to be transported can be supplied to an RT tube of the cryostat, with a transport device as described above, wherein the object to be transported is inserted into an above-described first transport container at the input point, the first transport container is moved from the input point to the first transfer point, a first pressure gas supply is switched on at the lower end of the first transport container, thereby lifting the object to be transported from the first transport container and transporting it within the transport tube in an upward direction into a second transport container described above that is located at the second transfer point, the object to be transported is locked in the second transport container, the first pressure gas supply is switched off and the object to be transported is transported from the second transfer point to the supply point by means of the second transport container, a second pressure gas supply to the area of the magnetic center (3) is switched on such that a gas cushion is formed in the RT tube, the object to be transported is released from the second transport container, thereby dropping the object to be transported onto the gas cushion formed in the RT tube, transporting it on the gas cushion in a downward direction into a measuring chamber within the RT tube until it comes to rest on a stop.

When the object to be transported has reached the measuring chamber, the second pressure gas supply is preferably switched off and magnetic resonance measurement, in particular NMR spectroscopy or ESR, is performed.

The object to be transported is preferably returned from the cryostat to the input point along the same path, wherein after the MR measurement the second pressure gas supply is switched on again and the object to be transported is returned on the gas cushion into the second transport container located above the supply point, the object to be transported is locked in the second transport container and the second pressure gas supply is switched off again, the object to be transported is returned in the second transport container from the supply point (Z) to the second transfer point, the first pressure gas supply is switched on to form a gas cushion in the transport tube, the object to be transported is released from the second transport container such that the object to be transported falls onto the gas cushion and is transported thereon to the first transfer point and into the first transport container located therebelow, and the first pressure gas supply is switched off again and the object to be transported that is located in the first transport container is returned from the first transfer point to the input point.

In a particularly advantageous fashion, a locking bolt is inserted into the second transport container for locking the object to be transported in the second transport container to prevent the object to be transported from falling down, and the locking bolt is reset for releasing the object to be transported.

Further advantages of the invention can be extracted from the description and the drawing. The features mentioned above and below may be used individually or collectively in arbitrary combination. The embodiments shown and described are not to be understood as exhaustive enumeration but have exemplary character for describing the invention.

BRIEF DESCRIPTION OF THE DRAWING

FIG. 2a schematically shows the operation principle of the transport device of FIG. 1;

FIG. 2b schematically shows the operation principle of a second conventional transport device according to [2];

FIG. 3a schematically shows the operation principle of the inventive device, wherein the object to be transported is supplied to the transport tube via horizontal displacement;

FIG. 3b schematically shows the operation principle of the inventive device, wherein the object to be transported is supplied to the transport tube via vertical displacement;

FIG. 5a is a schematic side view of a second embodiment of the inventive transport device, in which the object to be transported is supplied to the transport tube via a horizontal pivot motion;

FIG. 5b is a schematic view from above of a pivot arm with transport container;

FIG. 9a is a schematic sectional view of the upper area of the transport tube showing how an object to be transported has passed the locking bolt, which was unlocked through application of force, within the transport container through which pressure gas flows and which coincides (is aligned) with the transport tube;

FIG. 9b is a schematic sectional view of the upper area of the transport tube showing how an object to be transported is supported on the unlocked locking bolt within the transport container of FIG. 9a;

FIG. 9c is a schematic sectional view of the upper area of the transport tube showing how an object to be transported has passed, by force of gravity, the locking bolt, which was unlocked through application of a force, to then leave the lower opening of the transport container in the direction of the aligned transport tube, while the rate of fall of the object to be transported is controlled by means of a counteracting gas flow;

DESCRIPTION OF THE PREFERRED EMBODIMENT

Figure 1:
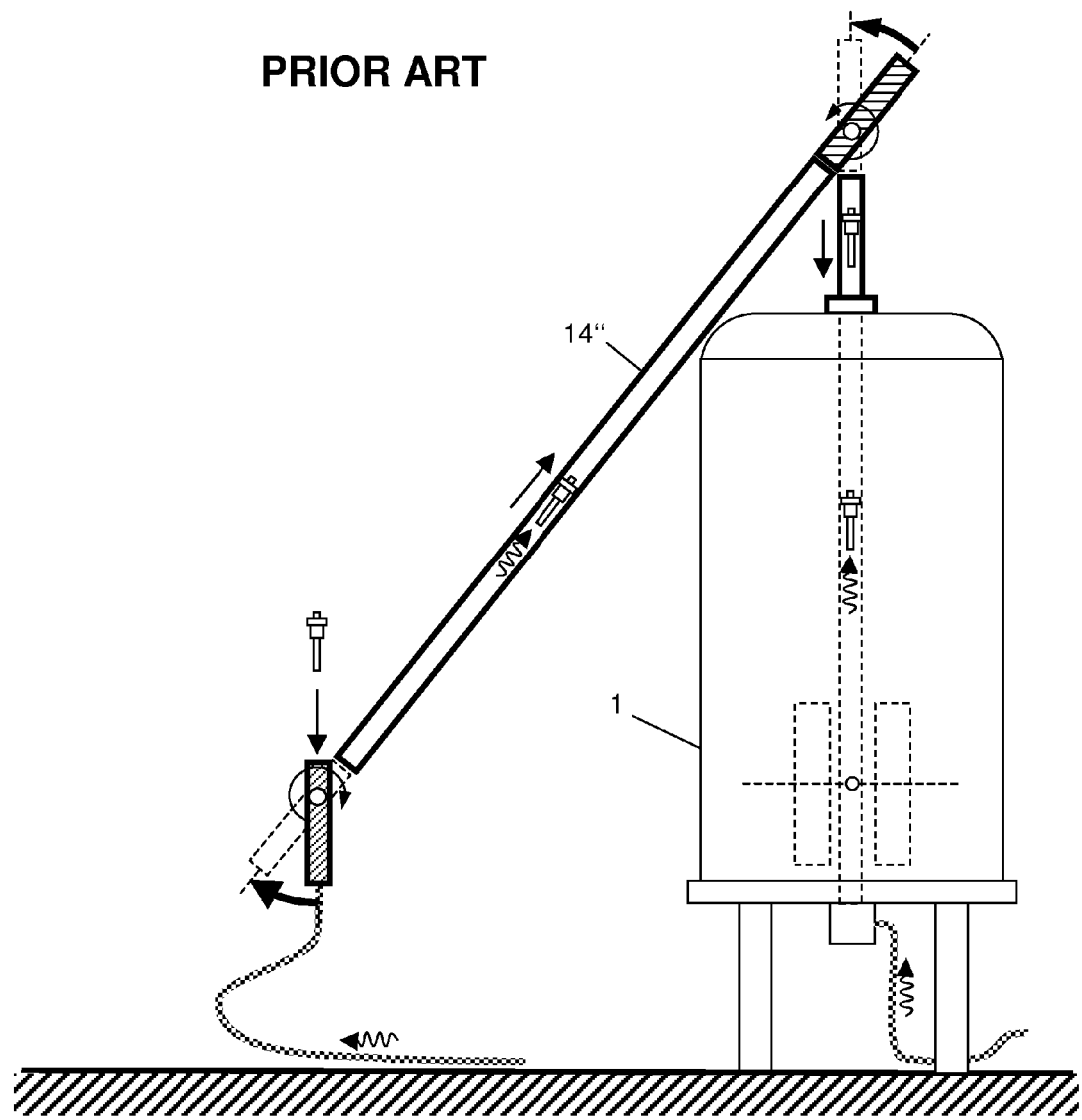
FIG. 1 schematically shows a functional principle of a conventional first transport device according to [1]

In the inventive automatic transport device, an object to be transported 18 comprising a sample tube 20 in a sample holder 19 is conveyed from an input point A (FIG. 3a, b), which is easily accessible to the user, to a supply point Z that is disposed above a continuous, vertically extending bore (RT tube 4) of a cryostat 1. The object to be transported is conveyed in three transport sections in each case either horizontally (from the input point A to a first transfer point B and from a second transfer point C to the supply point Z) or vertically (from the first transfer point B to the second transfer point C). The vertical transport is performed by means of a transport tube 14 within which the object to be transported 18 is pneumatically conveyed.

The transport tube 14 bridges the height difference between the first transfer point B and the second transfer point C next to the upper end of the RT tube 4 in an elegant, economical and extremely flexible fashion, since it can be individually adjusted to the local "on site" conditions. Due to this fact, the operating staff does not need any climbing aids such as ladders, stairs, scaffoldings etc. for changing the sample tubes 20. This increases the operational safety and the convenience for the operator, and reduces the risk of accidents for the laboratory staff.

Figure 4:
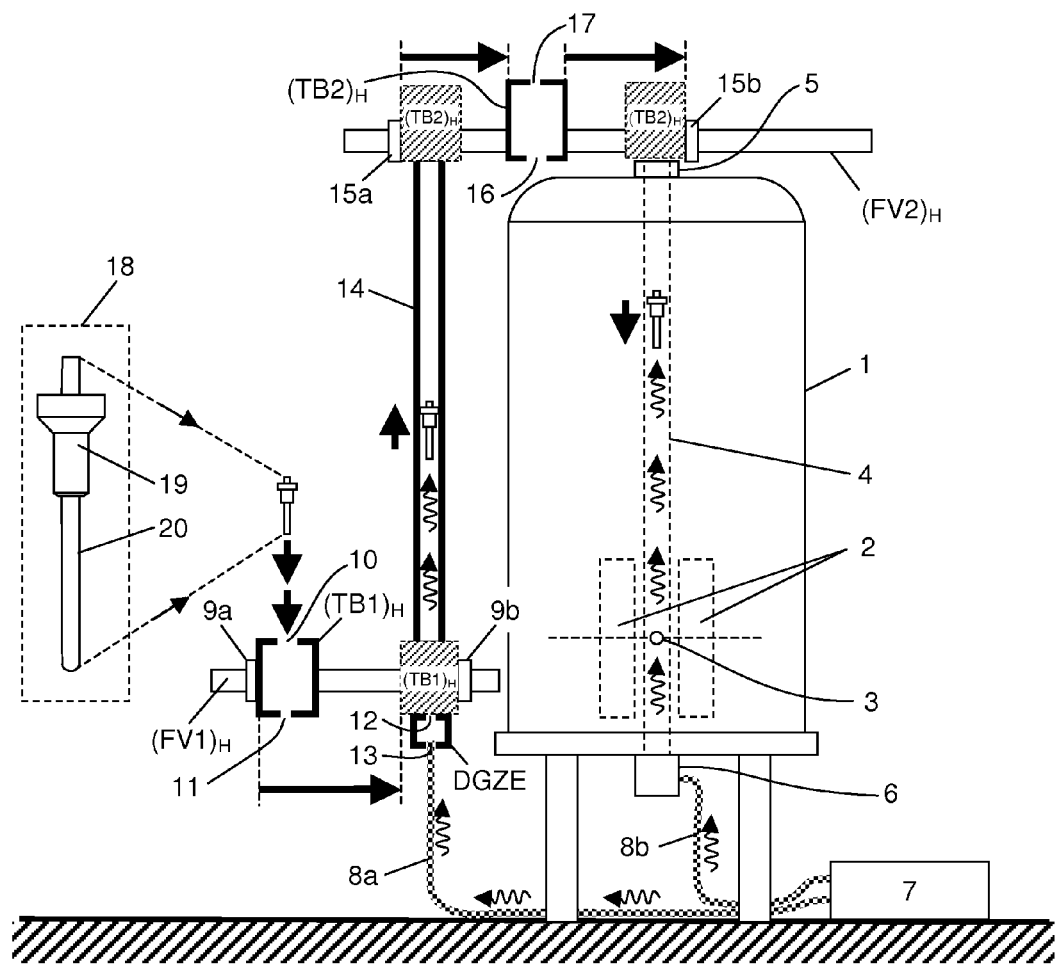
FIG. 4 is a schematic side view of a first embodiment, wherein the object to be transported is moved back and forth in an automated fashion via linear and horizontal movement between a location that is easily accessible to the operating staff and the upper end of the RT tube of an NMR cryostat.
Figure 7A:
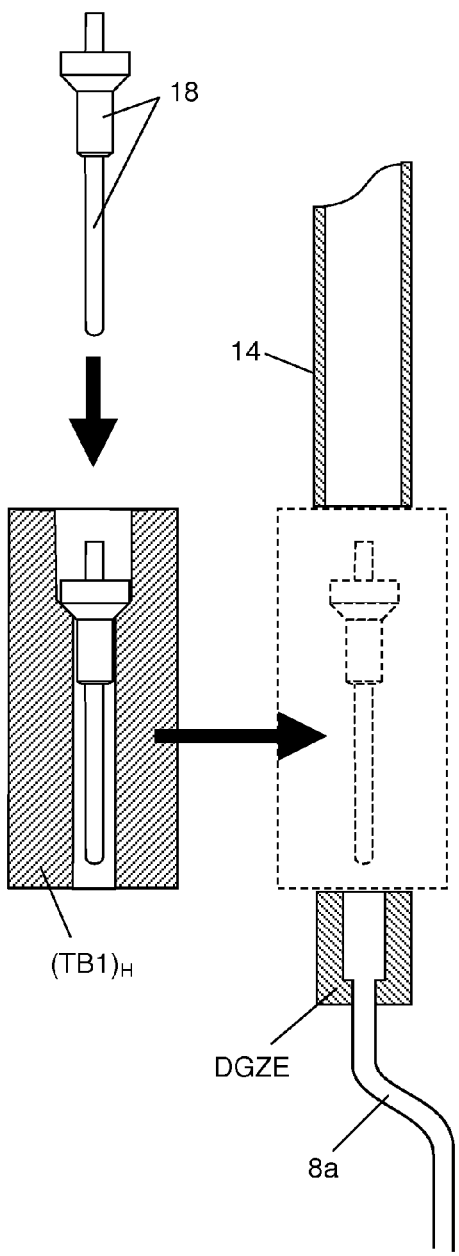
FIG. 7a is a schematic sectional view of the lower area of the transport tube showing how a transport container including supplied object to be transported is moved to coincide (be aligned) with the transport tube and the pressure gas supply element with mounted pressure gas line via a horizontal motion.
Figure 7B:
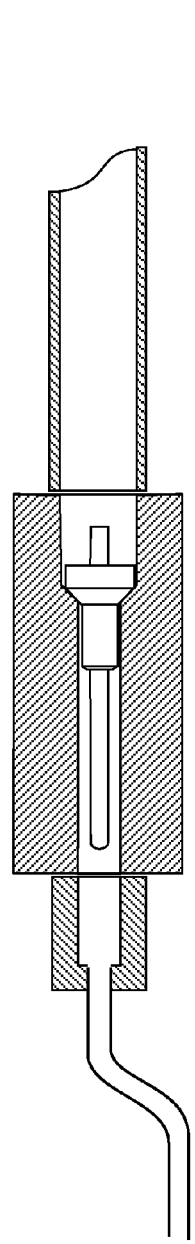
FIG. 7b is a schematic sectional view of the lower area of the transport tube showing how a transport container of FIG. 7a coincides (is aligned) with the transport tube and the pressure gas supply element with mounted pressure gas line.
Figure 7C:
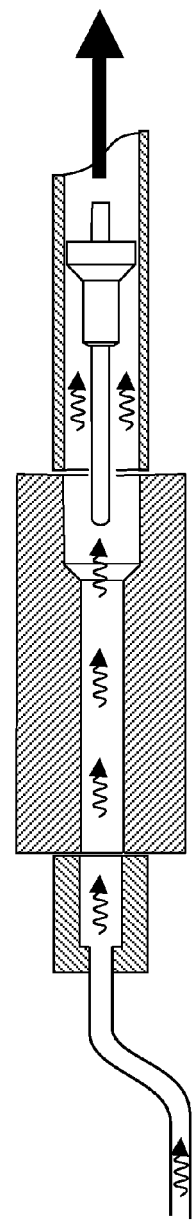
FIG. 7c is a schematic sectional view of the lower area of the transport tube showing how an object to be transported of FIG. 7b is conveyed into the transport tube through the transport container through which pressure gas flows from the direction of the pressure gas supply element and which is made to coincide (be aligned) with the transport tube.
Figures 8A, 8B, 8C:
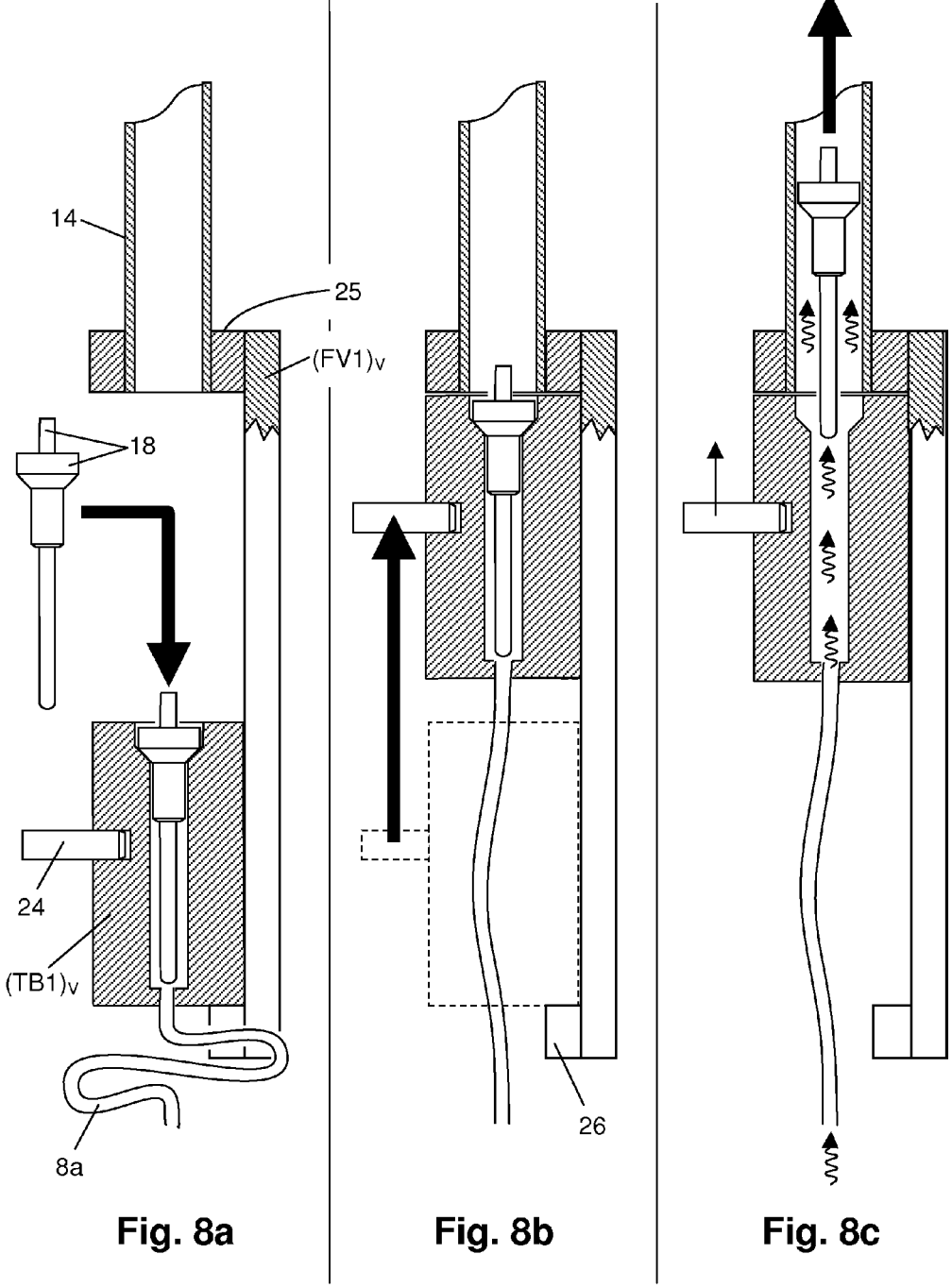
FIG. 8a is a schematic sectional view of the lower area of the transport tube showing how a transport container with mounted pressure gas hose, which is guided to coincide (be aligned) with the transport tube by means of a vertically arranged guiding device, is supplied with an object to be transported.
FIG. 8b is a schematic sectional view of the lower area of the transport tube showing how the transport container of FIG. 8a including object to be transported is lifted out of the stop at the lower end of the guiding device by a vertically acting force and is forced against the transport tube at the upper end of the guiding device.
FIG. 8c is a schematic sectional view of the lower area of the transport tube showing how the object to be transported is conveyed from the transport container of FIG. 8b, through which pressure gas flows and which is forced against the transport tube at the upper end of the guiding device by a vertically acting force, and is guided to coincide (be aligned) with the transport tube, into the transport tube.

The inventive device can be conveniently loaded with objects to be transported 18 at the input point A that is easily accessible to the operating staff in the vicinity of the lower end of the transport tube 14 without any further auxiliary means, which objects are to be measured in the magnetic center 3 of a superconducting magnet 2 in a superconducting magnet system. The automatic transport device is equipped by inserting the object to be transported 18 into a transport container $(TB1)_H$, $(TB1)_V$, as shown in FIGS. 4, 7a and 8a, which can be realized either manually or by means of customary gripping robots. FIG. 8a shows a variant that is preferably designed for manual operation, wherein the input point A is disposed below the first transfer point B. The transport containers $(TB1)_H$, $(TB1)_V$ can be transferred individually (FIG. 4, FIGS. 5a, b, FIG. 7, FIG. 8) or simultaneously with several objects to be transported $18_{1,2,3}$ (FIG. 6) to the first transfer point B.

The transport container $(TB1)_H$, $(TB1)_V$ has an upper opening 10 which can be moved to coincide with the lower opening of the transport tube 14, i.e. be aligned coaxially thereto, either automatically or manually using a transfer device, as soon as the transport container $(TB1)_H$, $(TB1)_V$ is equipped, wherein the separation between the transport container $(TB1)_H$, $(TB1)_V$ and the transport tube 14 should be minimum, preferably 0.1 mm to 0.3 mm, which prevents excessive and therefore inefficient outflow of pressure gas required for pneumatically conveying the object to be transported 18 (FIG. 5b, FIG. 6b, FIG. 7b, FIG. 8b).

The object to be transported 18 is then in the transfer position to a second transport container $(TB2)_H$ that should be located at a terminal stop 15a (FIG. 4) at the upper end of the transport tube 14 (second transfer point C) and has an opening 16 which faces the transport tube 14. By means of at least one sensor one can then ensure that the upper transport container $(TB2)_H$ is located at the terminal stop 15a (i.e. the transport container $(TB2)_H$ and the transport tube 14 are aligned coaxially with respect to each other, such that the lower opening 16 of the second transport container $(TB2)_H$ coincides with the upper opening of the transport tube 14). The second transport container $(TB2)_H$ is shown in detail in FIGS. 9a-c and has a locking bolt 28, by means of which the object to be transported 18 can be fixed within the second transport container $(TB2)_H$. The locking bolt 28 can be guided out of the interior (receiving bore) of the transport container $(TB2)_H$ by means of a lever 27 in order to receive the object to be transported 18 from the transport tube 14 or to discharge it from the second transport container $(TB2)_H$.

For transferring the object to be transported 18 from the first transport container $(TB1)_H$, $(TB1)_V$ to the second transport container $(TB2)_H$, the sensor ensures that the locking bolt 28 has been guided out of the receiving bore of the second transport container $(TB2)_H$ either manually or by means of an automatic system. A pressure gas generator 7 (FIG. 4) then guides pressure gas through a lower opening 13 of a pressure gas supply element DGZE via a pressure gas line 8a, and from there through an upper opening 12 of the pressure gas supply element DGZE into a lower opening 11 of the first transport container $(TB1)_H$, $(TB1)_V$ to the object to be transported 18 located therein, such that the latter is lifted on a gas cushion, is guided within the transport tube 14 through the lower opening 16 of the second transport container $(TB2)_H$ into the second transport container $(TB2)_H$ and triggers a signal via sensors, which signal reports the arrival of the object to be transported 18 in the second transport container $(TB2)_H$.

The sensor may e.g. be an optical sensor that is disposed in or on a bore 30 of the second transport container $(TB2)_H$. Upon arrival of the object to be transported 18 in the second transport container $(TB2)_H$, the bore 30 is covered by the object to be transported 18 (FIG. 9a) and can thereby trigger a signal in the optical sensor. The second transport container $(TB2)_H$ moreover has an upper ventilation opening 17. The ventilation opening 17 and the bores 30 ensure that the gas escaping in a upward direction past the object to be transported 18 is discharged to the outside to prevent gas accumulation which would slow down the transport process.

Figures 9A, 9B, 9C:
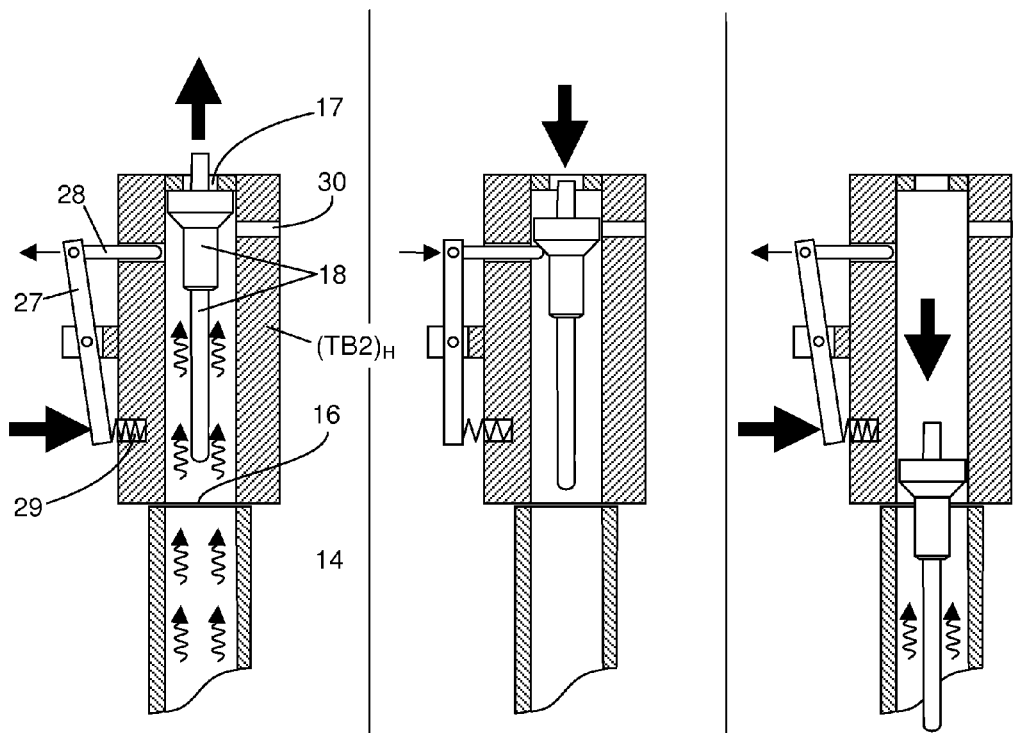

When the arrival of the object to be transported 18 has been reported, the locking bolt 28 is guided into the receiving bore of the transport container $(TB2)_H$ by means of the lever 27, and the pressure gas supply is interrupted. The locking bolt 28 prevents the object to be transported 18 from falling down, as is illustrated in FIG. 9b.

A guiding device $(FV2)_H$ then conveys the transport container $(TB2)_H$ to the upper end 5 of the RT tube 4 (FIG. 4). As soon as the sensors have ensured that the upper transport container $(TB2)_H$ is located at a terminal stop 15b, i.e. coincides (is coaxial) with the RT tube 4 of the cryostat 1, the lever 27 is actuated by activating an actuator, such that the locking bolt 28 no longer projects into the receiving bore of the transport container $(TB2)_H$ as is shown in FIG. 9c.

The RT tube 4 is connected to the pressure gas generator 7 by means of a further pressure gas line 8b such that the pressure gas can flow into the RT tube 4. FIG. 4 shows an embodiment, in which the pressure gas flows in at the lower end 6 of the RT tube 4 (with closing pin). However, the pressure gas is preferably introduced in the area of the magnetic center 3. The closing pin at the lower end 6 of the RT tube prevents the pressure gas from flowing in a downward direction. The pressure gas generator 7 then guides pressure gas through the pressure gas line 8b into the RT tube 4 for reducing the rate of fall until the object to be transported 18 is smoothly supported in the magnetic center 3 of the superconducting magnet 2 for an NMR measurement.

After the NMR measurement, the sensors ensure that the upper transport container $(TB2)_H$ is located at the terminal stop 15b, i.e. the lower opening 16 of the second transport container $(TB2)_H$ coincides (is coaxial) with the upper opening of the RT tube 4. When this is ensured, the lever 27 (FIG. 9a) is actuated through activating the actuator unless this has been previously effected, such that the locking bolt 28 no longer projects into the receiving bore of the transport container $(TB2)_H$. The pressure gas generator 7 (FIG. 4) then guides pressure gas through the connecting hose 8b into the RT tube 4 of the cryostat 1 and the receiving bore of the transport container $(TB2)_H$ until the sample holder 19 of the object to be transported 18 has passed the bore 30 (FIG. 9a). In order to accelerate this process, the upper ventilation opening 17 of the transport container $(TB2)_H$ provides a large recess through which the air displaced by the object to be transported 18 can escape. During passage of the bore 30, the sample holder 19 is detected by the sensors, the actuator is deactivated and the pressure gas supply is interrupted. Deactivation of the actuator causes a return spring 29 to force the locking bolt 28 back into the initial position within the surface of the receiving bore of the transport container $(TB2)_H$. In consequence of the interruption of the gas supply, the object to be transported 18 is lowered to such an extent that it is caught at the projecting locking bolt 28 (FIG. 9b). The guiding device $(FV2)_H$ then conveys the transport container $(TB2)_H$ to the upper end of the transport tube 14 (FIG. 4). As soon as the sensors have ensured that the upper transport container $(TB2)_H$ is at the terminal stop 15a, i.e. coincides (is coaxial) with the transport tube 14, the lever 27 (FIG. 9c) is operated by activating the actuator, such that the locking bolt 28 no longer projects into the surface of the receiving bore of the transport container $(TB2)_H$.

In order to reduce the rate of fall of the object to be transported 18, the pressure gas generator 7 (FIG. 4) guides pressure gas through the connecting hose 8a, the pressure gas supply element DGZE, the receiving bore of the transport container $(TB2)_H$, the transport tube 14 and the transport container $(TB1)_H$, $(TB1)_V$ until the object to be transported 18 is gently supported in the transport container $(TB1)_H$, $(TB1)_V$.

In reverse order with respect to FIGS. 7a-c and FIGS. 8a-c, the upper opening 10 of the transport container $(TB1)_H$, $(TB1)_V$ can be moved by means of the transfer device from its position with respect to the lower end of the transport tube 14 by moving the transport container $(TB1)_H$,$(TB1)_V$ such that the object to be transported 18 can be removed by hand or by means of a customary gripping robot and be supplied to further processes.

FIGS. 4-8 show different embodiments of the transfer device from the input point A to the first transfer point B.

FIG. 4 shows the supply of the object to be transported 18 by means of a horizontal guiding device, in the present case in the form of a guiding rail $(FV1)_H$ with a terminal stop 9a at the input point A and a further terminal stop 9b below the transport tube 14, wherein the terminal stop 9b is arranged in such a fashion that the upper opening of the first transport container $(TB1)_H$ is orientated coaxially with respect to the lower opening of the transport tube 14 when the terminal stop 9b is reached.

FIGS. 5a, b show the supply of the object to be transported 18 by means of a pivot arm 21. The pivot arm 21 is rotatably mounted to an attachment 22 and can be pivoted about a vertical axis such that the first transport container $(TB1)_H$ that is located in the pivot arm can be moved through this pivot motion from the input point A to the first transfer point B.

Figures 6A, 6B:
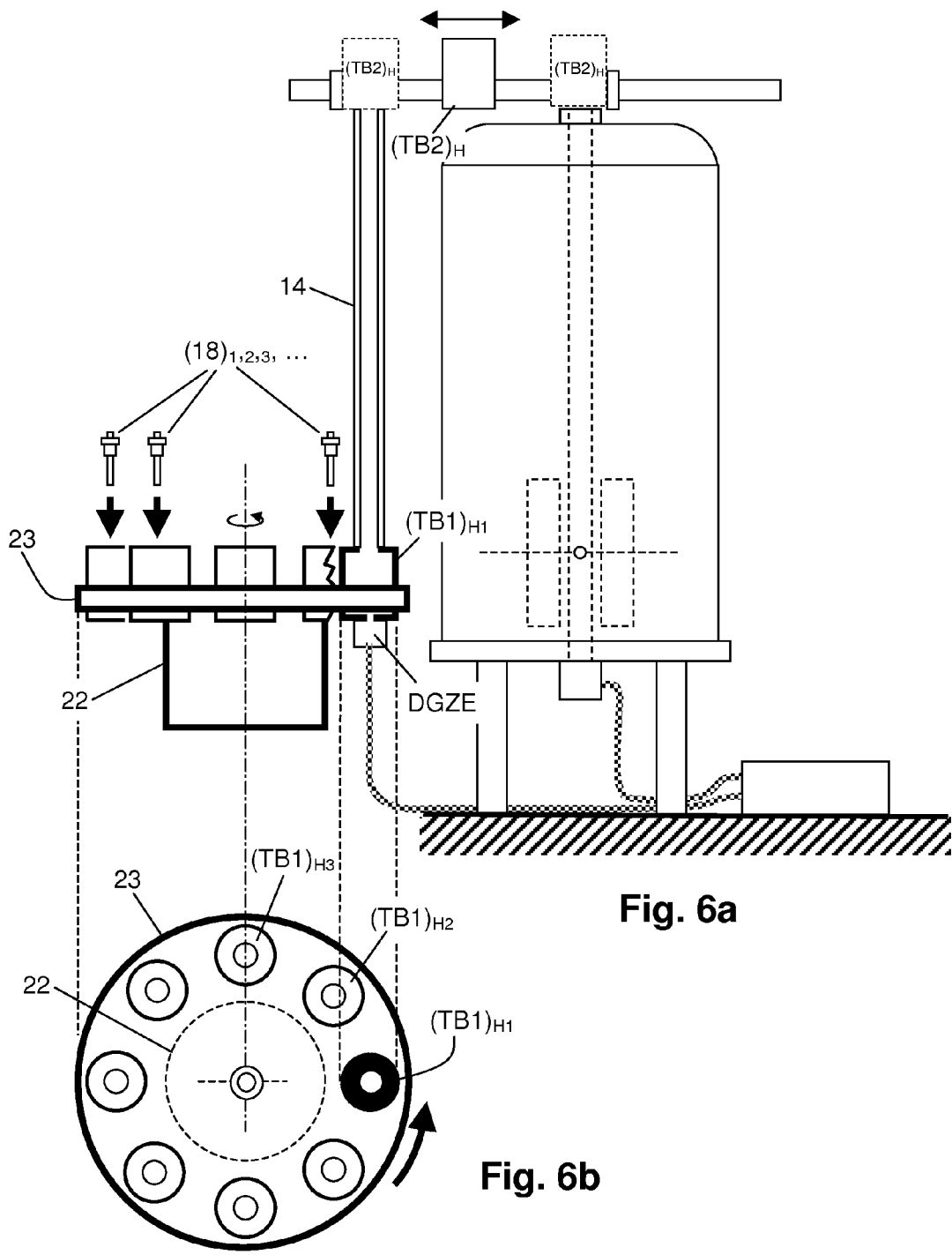
FIG. 6a is a schematic side view of a third embodiment of the inventive transport device, wherein one or more objects to be transported can be supplied from a carousel cassette in selected or sequential order via a horizontal motion.
FIG. 6b is a schematic view from above of the carousel with transport container.

FIGS. 6a, b show the supply of the object to be transported 18 by means of a carousel 23. The carousel 23 is mounted to an attachment 22a and can be rotated about a vertical axis. Several first transport containers $(TB1)_{H1}$,$(TB1)_{H2}$, $(TB1)_{H3}$ are disposed on a circle whose center is the axis of rotation, and each transport container receives one object to be transported $18_1$, $18_2$, $18_3$ and can be moved from the input point A to the first transfer point B through rotation of the carousel.

FIGS. 8a-c show one possibility of vertically moving the first transport container $(TB1)_V$ to the first transfer point B by means of a vertical guiding device $(FV1)_V$. In this case, the first transport container $(TB1)_V$ is directly connected to the pressure gas line 8a. After insertion of the object to be transported 18 into the first transport container $(TB1)_V$, the first transport container $(TB1)_V$ is moved in a vertical direction with respect to the lower end of the transport tube 14 by means of a bolt 24 projecting from the first transport container (TB1)$_V$, and is forced against it. The guiding device $(FV1)_V$ comprises a guiding rail with a lower stop 26 and a flange 25 by means of which the guiding device $(FV1)_V$ is mounted to the transport tube 14.

Figures 10A, 10B:
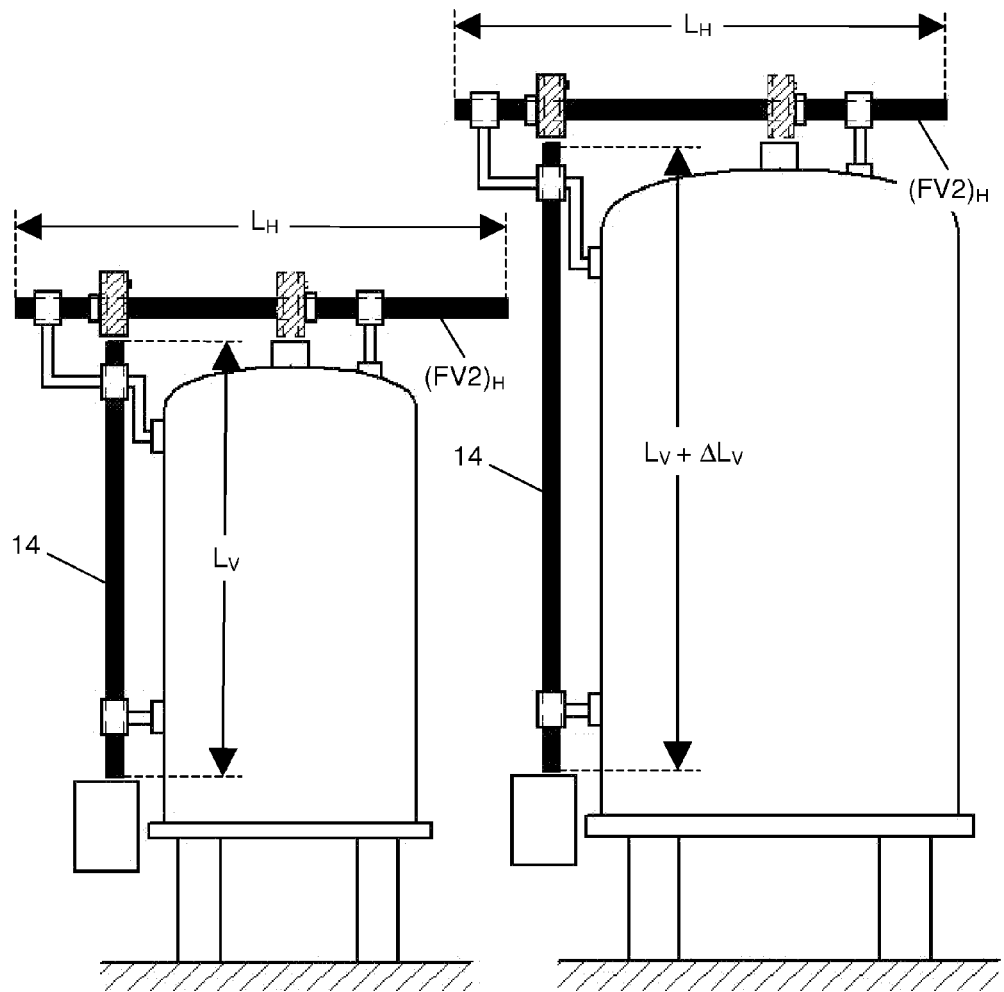
FIG. 10a is a schematic view of an inventive transport device with a standardized guiding device and a transport tube, the length of which is individually adjusted to a superconducting low-field magnet system.
FIG. 10b is a schematic view of an inventive transport device with a standardized guiding device and a transport tube, the length of which is individually adjusted to a superconducting high-field magnet system.

The inventive transport device can be directly mounted to the cryostat 1, as is shown in FIGS. 10a, b, thereby minimizing the transmission of vibrations from the surroundings. FIGS. 10a, b also show how the inventive transport device can be adjusted to different cryostats.

LIST OF REFERENCE NUMERALS

A, A" input point
B, B'. B" first transfer point
C, C', C" second transfer point
D' third transfer point
Z supply point to the RT tube of the cryostat
$(TB1)_H$ transport container that is located in the lower area of the transport tube 14 and is moved in a horizontal direction
$(TB1)_V$ transport container that is located in the lower area of the transport tube 14 and is moved in a vertical direction
$(TB1)_{H1,H2,H3}$ transport container of the carousel (23)
$(FV1)_H$ guiding rail that is located in the lower area of the transport tube 14 and is used to guide the transport container $(TB1)_H$ in a horizontal direction
$(FV1)_V$ guiding device that is located in the lower area of the transport tube 14 and is used to guide the transport container $(TB1)_V$ in a vertical direction
$(TB2)_H$ transport container that is located in the upper area of the transport tube 14 and is moved in a horizontal direction
$(FV2)_H$ guiding device that is located in the upper area of the transport tube 14 and is used to guide the transport container $(TB2)_H$ in a horizontal direction
DGZE pressure gas supply element to the transport containers $(TB1)_H$ and $(TB1)_{H1,H2,H3}$
1 cryostat
2 superconducting magnet (SL magnet)
3 magnetic center of the SL magnet
4 RT tube of the cryostat 1
5 upper end of the RT tube 4
6 lower end of the RT tube 4 with closing pin
7 pressure gas generator including control
8a,b pressure gas lines
9a,b terminal stops on the guiding rail $(FV1)_H$ for delimiting the displaceable area of the transport container $(TB1)_H$
10 upper opening of the transport container $(TB1)_H$ that is used to receive or remove the object to be transported 18
11 lower opening of the transport container $(TB1)_H$ that is used to supply pressure gas,
12 upper opening of the pressure gas supply element that is used to supply pressure gas to the transport containers $(TB1)_H$ and $(TB1)_{H1,H2,H3}$
13 lower opening of the pressure gas supply element for connection of the pressure gas line 8a
14 transport tube for pneumatic transport of the object to be transported between two different heights
14" inclined tube for pneumatic transport of the object to be transported between two different heights
15a,b terminal stops on the second guiding device $(FV2)_H$ for delimiting the displaceable area of $(TB2)_H$
16 lower opening of the second transport container $(TB2)_H$ for receiving or removing the object to be transported
17 upper opening of the second transport container $(TB2)_H$ for discharge of the superfluous pressure gas
18 object to be transported
$18_{1,2,3}$ several objects to be transported in the carousel (23)
119 sample holder (spinner)
20 NMR sample tube 21 pivot arm for the transport container $(TB1)_H$
22 attachment of the pivot arm 21 including rotary drive
22a attachment of the carousel 23 including rotary drive
23 carousel with integrated transport containers $(TB1)_{H1}$, $(TB1)_{H2}$, $(TB1)_{H3}$
24 bolt for manually moving the first transport container $(TB1)_V$ in a vertical direction
25 flange at the lower end of the transport tube 14
26 stop at the lower end of the guiding rail $(FV1)_V$
27 lever for actuating the locking bolt 28
28 locking bolt for preventing the object to be transported from falling down
29 return spring of the lever 27
30 bore for optically monitoring the object to be transported
31 vertically arranged pneumatic axis, self-supporting with stable foundation
32 special transport container that can be coupled in and out for receiving the object to be transported 18, wherein the transport container can be recoupled between the horizontal and vertical linear axes
33 flexible hose in which the object to be transported 18 is transported between the points D and Z

REFERENCE LIST

[1] DE 3729819 C2 (A. Kuster)
[2] SampleRail (Bruker) (http://www.bruker-biospin.com/sample_rail.html)
[3] Sample Jet (BRUKER) (http://www.bruker-biospin.com/samplejet.html)
[4] BACS (Bruker) (http://www.bruker-biospin.com/bacs.html)
[5] NMR Case (Bruker) (http://www.bruker-biospin.com/sample_rail0.html)
[6] Sample Changer ASC (JEOL) (http://www.jeolusa.com/PRODUCTS/AnalyticalInstruments/NuclearMagneticResonance/SampleChangers/tabid/389/Default.aspx)
[7] Carousel Autosampler (VARIAN) (http://www.varianinc.com/cgi-bin/nav?products/nmr/accessory/auto_samplers/carousel/carousel_specs&cid=KLILILKJFN)

We claim:

1. A transport device for conveying an object between an input point, where the object is inserted into and removed from the transport device, and a supply point where the object is supplied to a room temperature tube of a cryostat, the object containing an NMR measuring sample and a sample holder, the input point being both horizontally and vertically spaced apart from the supply point, the device comprising:
a first transport container disposed at the input point for receiving the object;
a first transfer device disposed between the input point and a first transfer point for conveying said first transport container from the input point to the first transfer point;
a vertically disposed transport tube for pneumatically conveying the object to be transported within that transport tube from the first transfer point at a lower end of said transport tube, to a second transfer point at an upper end of said transport tube;
a second transport container disposed at the second transfer point for receiving the object; and
a second transfer device disposed between the second transfer point and the supply point for conveying said second transport container between the second transfer point and the supply point.

2. The transport device of claim 1, wherein said first transfer device comprises a guiding rail along which said first transport container is moved.

3. The transport device of claim 1, wherein said first transfer device comprises a pivot arm that is rotated about an axis and is structured to receive said first transport container and to convey said first transport container from the input point to the first transfer point by means of a rotary motion of said pivot arm.

4. The transport device of claim 1, wherein said first transfer device comprises a carousel that can be rotated about an axis of rotation and has a plurality of first transport containers that are disposed in a circle, a center of the circle being located on said axis of rotation, wherein said plurality of first transport containers are moved from the input point to the first transfer point through rotary motion of said carousel.

5. The transport device of claim 1, wherein said second transfer device has a guiding rail along which said second transport container can be moved.

6. The transport device of claim 1, wherein said transport tube has a vertical symmetry axis and both the first transfer point and the second transfer point are disposed on said symmetry axis of said transport tube.

7. The transport device of claim 1, wherein said first transport container has an upper opening for receiving the object, a diameter of said opening being equal to an inner diameter of said transport tube.

8. The transport device of claim 1, wherein said second transport container has a lower opening for receiving the object, a diameter of said lower opening being equal to an inner diameter of said transport tube.

9. The transport device of claim 1, wherein the input point is located at a height above a horizontal bottom level that is easily accessible to a user or which is at a breast level of a person.

10. The transport device of claim 1, wherein the second transfer point is disposed horizontally proximate to the supply point.

11. The transport device of claim 1, wherein the input point is disposed vertically below the first transfer point.

12. The transport device of claim 1, wherein the input point is located horizontally proximate to the first transfer point.

13. The transport device of claim 1, further comprising a pressure gas supply element disposed vertically below and at a separation from the first transfer point, said separation being selected such that said first transport container just fits into a space between said lower end of said transport tube and an upper end of said pressure gas supply element, wherein said pressure gas supply element has an opening facing said lower end of the transport tube, and is connected to a pressure gas generator by means of a pressure gas line.

14. The transport device of claim 13, wherein said opening of said pressure gas supply element is orientated coaxially with respect to said transport tube.

15. The transport device of claim 13, wherein, in an operating state, said pressure gas supply element is connected in a gas-tight fashion to said pressure gas line on a side opposite to said opening.

16. The transport device of claim 11, wherein, in an operating state, a pressure gas line is connected in a gas-tight fashion to a lower opening of said first transport container.

17. The transport device of claim 1, further comprising a continuous and vertically extending room temperature tube for receiving the object, the input point being horizontally spaced apart from said cryostat, wherein the supply point is located above said room temperature tube on a symmetry axis thereof.

18. The transport device of claim 17, wherein the transport device is exclusively rigidly connected to said cryostat.

19. The transport device of claim 17, wherein an inner diameter of said transport tube is equal to an inner diameter of said room temperature tube.

20. The transport device of claim 17, further comprising a pressure gas generator connected to said room temperature tube by means of a pressure gas line in such a fashion that pressure gas can flow from an area of a magnetic center to an upper end of said room temperature tube.

21. The transport device of claim 1, wherein said first transport container has an upper opening for receiving the object and an oppositely disposed lower opening for supplying pressure gas.

22. The transport device of claim 1, wherein said second transport container has an upper ventilation opening and an oppositely disposed lower opening for receiving the object and with a holding device that can be activated and deactivated to prevent the object from falling down in a deactivated state and to release the object in an activated state.

23. The transport of claim 22, wherein said holding device has a locking bolt that can be displaced in a horizontal direction.

24. A method for conveying an object between an input point, where the object is inserted into and removed from a transport device, and a supply point where the object is supplied to a room temperature tube of a cryostat, the object containing an NMR measuring sample and a sample holder, the input point being both horizontally and vertically spaced apart from the supply point, the method comprising the steps of:
a) receiving the object with a first transport container disposed at the input point;
b) conveying, with a first transfer device, the first transport container between the input point and a first transfer point;
c) pneumatically conveying the object to be transported within a vertically disposed transport tube from the first transfer point at a lower end of the transport tube to a second transfer point at an upper end of the transport tube;
d) receiving the object with a second transport container disposed at the second transfer point; and
e) conveying, with a second transfer device, the second transport container between the second transfer point and the supply point.

25. The method of claim 24, wherein a first pressure gas supply is switched on at a lower end of the first transport container thereby lifting the object out of the first transport container and conveying the object within the transport tube in an upward direction into the second transport container, the object thereby being locked in the second transport container, wherein the first pressure gas supply is switched off and the object is transported from the second transfer point to the supply point by means of the second transport container, a second pressure gas supply thereby being switched on in a area of a magnetic center such that a gas cushion is formed in the room temperature tube, wherein the object is released from the second transport container thereby dropping the object onto the gas cushion formed in the room temperature tube and transporting the object on the gas cushion in a downward direction into a measuring chamber within the room temperature tube until the object comes to rest on a stop.

26. The method of claim 25, wherein, after arrival of the object in the measuring chamber, the second pressure gas supply is switched off and magnetic resonance measurements, NMR spectroscopy or ESR are performed.

27. The method of claim 26, wherein, after the magnetic resonance measurement, the second pressure gas supply is switched on again and the object is returned on the gas cushion into the second transport container located above the supply point, the object being locked in the second transport container, and the second pressure gas supply is switched off again, wherein the object in the second transport container is returned from the supply point to the second transfer point, the first pressure gas supply being switched on such that a gas cushion forms in the transport tube, wherein the object is released from the second transport container and falls onto the gas cushion to be transported into the first transport container located at the first transfer point, wherein the first pressure gas supply is switched off again and the object that is located in the first transport container is returned from the first transfer point to the input point.

28. The method of claim 25, wherein, for locking the object in the second transport container, a locking bolt is inserted into the second transport container, which prevents the object from falling down, the locking bolt being reset for releasing the object.

* * * * *